United States Patent
Lee et al.

(10) Patent No.: US 8,294,512 B2
(45) Date of Patent: Oct. 23, 2012

(54) BOOTSTRAPPED CLOCK GENERATOR AND TRACK-AND-HOLD CIRCUIT INCLUDING THE SAME

(75) Inventors: Jungho Lee, Gunpo-si (KR); Heung-Bae Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 261 days.

(21) Appl. No.: 12/782,175

(22) Filed: May 18, 2010

(65) Prior Publication Data
US 2011/0018589 A1 Jan. 27, 2011

(30) Foreign Application Priority Data
Jul. 21, 2009 (KR) .................. 10-2009-0066526

(51) Int. Cl.
*H02M 3/07* (2006.01)
(52) U.S. Cl. .................. 327/589; 327/390
(58) Field of Classification Search .................. 327/390, 327/589
See application file for complete search history.

(56) References Cited

U.S. PATENT DOCUMENTS 8,044,705 B2 * 10/2011 Nandi et al. .................. 327/536
2007/0146191 A1 6/2007 Iwata et al.

FOREIGN PATENT DOCUMENTS

| JP | 2007174288 | 7/2007 |
| JP | 2008061206 | 3/2008 |
| KR | 100838402 | 6/2008 |

* cited by examiner

*Primary Examiner* — Lincoln Donovan
*Assistant Examiner* — Daniel Rojas
(74) *Attorney, Agent, or Firm* — Onello & Mello, LLP

(57) ABSTRACT

A track-and-hold circuit includes a bootstrapped clock generator and a track-and-hold unit. The bootstrapped clock generator receives an input voltage signal and generates a sampling control signal having a voltage level lower than or equal to a level of a power supply voltage by maintaining an initial level of a boost capacitor voltage at a level lower than the level of the power supply voltage. The boost capacitor voltage is a voltage that is charged across a boost capacitor included in the bootstrapped clock generator and the sampling control signal is generated based on a clock signal. The track-and-hold unit samples and holds the input voltage signal in response to the sampling control signal to generate a sampled signal.

5 Claims, 4 Drawing Sheets

US 8,294,512 B2

BOOTSTRAPPED CLOCK GENERATOR AND TRACK-AND-HOLD CIRCUIT INCLUDING THE SAME

CROSS-REFERENCE TO RELATED APPLICATION

This application claims priority under 35 USC §119 to Korean Patent Application No. 10-2009-0066526, filed on Jul. 21, 2009 in the Korean Intellectual Property Office (KIPO), the contents of which are herein incorporated by reference in their entirety.

BACKGROUND

1. Technical Field

Example embodiments relate to a track-and-hold circuit, and more particularly to a track-and-hold circuit including a bootstrapped clock generator.

2. Description of the Related Art

Folding analog-to-digital converters are widely used in communication systems because they offer the advantages of high resolution, relatively low power consumption and relatively small size. Sample-and-hold circuits or track-and-hold circuits may be employed in the folding analog-to-digital converters to sample and hold input signals, such as analog signals. Recently, bootstrapped track-and-hold circuits have become popular for sampling input signals that have high resolution.

In conventional bootstrapped track-and-hold circuits, the level of the boosting voltage, which indicates the voltage at a boost node connected to a boost capacitor, is generally higher than the level of the power supply voltage. For this reason, additional protection circuits are required for protecting other elements used in the conventional bootstrapped track-and-hold circuits, and thus, the structure of conventional bootstrapped track-and-hold circuits can be quite complex.

SUMMARY

The inventive concepts are provided to substantially obviate one or more problems due to limitations and disadvantages of the related art.

Some example embodiments provide a bootstrapped clock generator that has a relatively simple structure and has improved reliability characteristics.

Some example embodiments provide a track-and-hold circuit that includes the bootstrapped clock generator.

According to some example embodiments, a track-and-hold circuit includes a bootstrapped clock generator and a track-and-hold unit. The bootstrapped clock generator receives an input voltage signal and generates a sampling control signal having a voltage level lower than or equal to a level of a power supply voltage by maintaining an initial level of a boost capacitor voltage at a level lower than the level of the power supply voltage. The boost capacitor voltage is a voltage that is charged across a boost capacitor included in the bootstrapped clock generator and the sampling control signal is generated based on a clock signal. The track-and-hold unit samples and holds the input voltage signal in response to the sampling control signal to generate a sampled signal.

In some embodiments, a level of a boosting voltage may be lower than or equal to the level of the power supply voltage when the bootstrapped clock generator receives the input voltage signal. The boosting voltage may be a voltage at a boost node to which the boost capacitor is connected.

In some embodiments, the bootstrapped clock generator may include the boost capacitor, a first p-type metal oxide semiconductor (PMOS) transistor, a first switch, a second switch, a second PMOS transistor and a third switch.

The boost capacitor may be connected between a boost node and a first node. The first PMOS transistor may be connected between the power supply voltage and the boost node. A gate of the first PMOS transistor may receive a first clock signal. A first switch may selectively connect the input voltage signal to the first node in response to the first clock signal and a second clock signal. The second clock signal may be an inversion signal of the first clock signal. The second switch may selectively connect a reference voltage signal to the first node in response to the second clock signal. A level of the reference voltage signal may be lower than a maximum level of the input voltage signal. The second PMOS transistor may transfer a boosting voltage to a second node in response to the second clock signal and may generate the sampling control signal. The boosting voltage may be a voltage at the boost node. The third switch may reset the second node in response to the second clock signal.

The third switch may include a first MOS transistor and a second MOS transistor. The first MOS transistor may be connected to the second node. A gate of the first MOS transistor may receive the power supply voltage. The second MOS transistor may be connected between the first MOS transistor and a ground voltage. A gate of the second MOS transistor may receive the second clock signal.

The bootstrapped clock generator may further include a first input buffer and a second input buffer. The first input buffer may buffer the input voltage signal to provide the buffered input voltage signal to the first switch. The second input buffer may buffer the reference voltage signal to provide the buffered reference voltage signal to the second switch.

The track-and-hold unit may include a MOS transistor and a capacitor. The MOS transistor may transfer the input voltage signal to a third node in response to the sampling control signal. The capacitor may be connected to the third node. The track-and-hold unit may further include an input buffer and an output buffer. The input buffer may buffer the input voltage signal to provide the buffered input voltage signal to the MOS transistor. The output buffer may buffer a voltage of the third node to output the sampled signal.

The track-and-hold unit may include a first MOS transistor, a second MOS transistor and a capacitor. The first MOS transistor may transfer the input voltage signal to a third node in response to the sampling control signal. The second MOS transistor may be connected between the third node and a fourth node. A first electrode and a second electrode of the second MOS transistor may be electrically connected to each other. A gate of the second MOS transistor may receive the clock signal. The capacitor may be connected to the fourth node. The track-and-hold unit may further include an input buffer and an output buffer. The input buffer may buffer the input voltage signal to provide the buffered input voltage signal to the first MOS transistor. The output buffer may buffer a voltage of the fourth node to output the sampled signal.

According to some example embodiments, a bootstrapped clock generator includes a boost capacitor, a first p-type metal oxide semiconductor (PMOS) transistor, a first switch, a second switch, a second PMOS and a third switch. The boost capacitor is connected between a boost node and a first node. The first PMOS transistor is connected between a power supply voltage and the boost node. A gate of the first PMOS transistor receives a first clock signal. The first switch selectively connects an input voltage signal to the first node in response to the first clock signal and a second clock signal.

The second clock signal is an inversion signal of the first clock signal. The second switch selectively connects a reference voltage signal to the first node in response to the second clock signal. The level of the reference voltage signal is lower than a maximum level of the input voltage signal. The second PMOS transistor transfers a boosting voltage to a second node in response to the second clock signal and generates the sampling control signal. The boosting voltage is a voltage at the boost node. The third switch resets the second node in response to the second clock signal.

In some embodiments, the sampling control signal having a voltage level lower than or equal to a level of the power supply voltage may be generated by maintaining an initial level of a boost capacitor voltage at a level lower than the level of the power supply voltage. The boost capacitor voltage may be a voltage that is charged across the boost capacitor.

In some embodiments, a level of a boosting voltage may be lower than or equal to a level of the power supply voltage when the bootstrapped clock generator receives the input voltage signal. The boosting voltage may be a voltage at the boost node.

The third switch may include a first MOS transistor and a second MOS transistor. The first MOS transistor may be connected to the second node. A gate of the first MOS transistor may receive the power supply voltage. The second MOS transistor may be connected between the first MOS transistor and a ground voltage. A gate of the second MOS transistor may receive the second clock signal.

The bootstrapped clock generator may further include a first input buffer and a second input buffer. The first input buffer may buffer the input voltage signal to provide the buffered input voltage signal to the first switch. The second input buffer may buffer the reference voltage signal to provide the buffered reference voltage signal to the second switch.

Accordingly, in the track-and-hold circuit according to some example embodiments, the level of the boosting voltage, which indicates a voltage at the boost node to which the boost capacitor is connected, is lower than the level of the power supply voltage, and thus the track-and-hold circuit need not include the additional protection circuits, may have a relatively simple structure and may have improved reliability characteristics.

In the track-and-hold circuit, the bootstrapped clock generator may include a replica input buffer such that configuration of the replica input buffer can be substantially the same as the configuration of the input buffer included in the track-and-hold unit. Therefore, a path for the input signals through the track-and-hold unit and a path for the boosting voltage through the bootstrapped clock generator can be separated, and thus, glitch noise can be reduced and settling time of the sampled signal can be decreased.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF EMBODIMENTS

Figure 1:
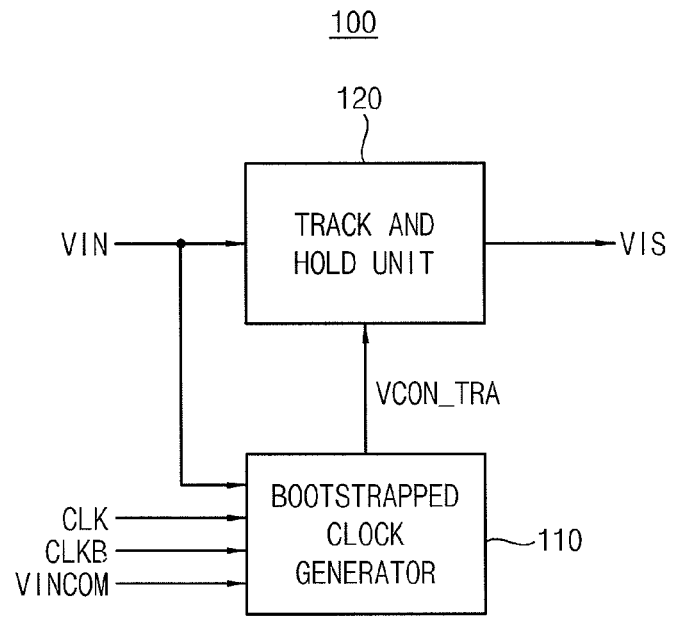
FIG. 1 is a block diagram illustrating a track-and-hold circuit according to some example embodiments.

Various example embodiments will be described more fully with reference to the accompanying drawings, in which embodiments are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the terminologies "track-and-hold circuit" and "sample-and-hold circuit" have substantially the same meanings. For example, a track-and-hold circuit or a sampleand-hold circuit can have substantially the same configurations and operations that sample and hold an input signal to generate the sampled signal.

FIG. 1 is a block diagram illustrating a track-and-hold circuit 100 according to some example embodiments.

Referring to FIG. 1, the track-and-hold circuit 100 includes a bootstrapped clock generator 110 and a track-and-hold unit 120.

The bootstrapped clock generator 110 generates a sampling control signal VCON_TRA having a voltage level lower than or equal to a level of a power supply voltage by maintaining an initial level of a boost capacitor voltage at a level lower than the level of the power supply voltage. The boost capacitor voltage is a voltage charged across a boost capacitor included in the bootstrapped clock generator 110. The initial level of the boost capacitor voltage indicates a level of the boost capacitor voltage when a logic level of a first clock signal CLK is maintained a first logic level, such as logic low level during a sufficient time and the boost capacitor is fully charged.

The bootstrapped clock generator 110 generates the sampling control signal VCON_TRA based on the first clock signal CLK, a second clock signal CLKB, a reference voltage signal VINCOM and an input voltage signal VIN. The second clock signal CLKB may be an inversion signal of the first clock signal CLK.

The track-and-hold unit 120 samples and holds the input voltage signal VIN in response to the sampling control signal VCON_TRA to generate the sampled signal VIS.

In the track-and-hold circuit 100 of FIG. 1, the initial level of the boost capacitor voltage may be lower than the level of the power supply voltage. Also, the sampling control signal VCON_TRA may have a voltage level that is lower than or equal to the voltage level of the power supply voltage. Accordingly, the track-and-hold circuit 100 can have a more simple structure and can offer improved reliability characteristics.

Figure 2:
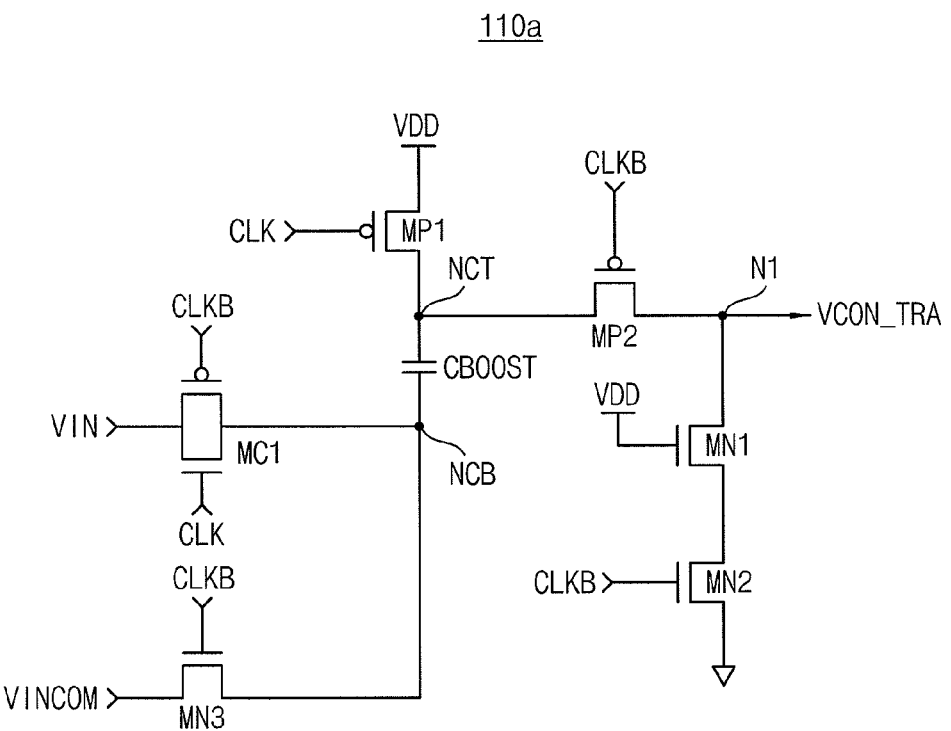
FIG. 2 is a circuit diagram illustrating an example of a bootstrapped clock generator included in the track-and-hold circuit of FIG. 1.

FIG. 2 is a circuit diagram illustrating an example of a bootstrapped clock generator 110a included in the track-and-hold circuit 100 of FIG. 1.

Referring to FIG. 2, the bootstrapped clock generator 110a may include a boost capacitor CBOOST, a complementary metal oxide semiconductor (CMOS) transistor MC1, a first p-type metal oxide semiconductor (PMOS) transistor MP1, a second PMOS transistor MP2, a first n-type metal oxide semiconductor (NMOS) transistor MN1, a second NMOS transistor MN2 and a third NMOS transistor MN3.

The boost capacitor CBOOST is connected between a boost node NCT and a first node NCB. The first PMOS transistor MP1 has a first electrode (for example, a source) connected to the power supply voltage VDD, a second electrode (for example, a drain) connected to the boost node NCT and a gate receiving the first clock signal CLK. The CMOS transistor MC1 may be a first switch that selectively connects (or transmits) the input voltage signal VIN to the first node NCB in response to the first and second clock signals CLK and CLKB. The second clock signal CLKB may be an inversion signal of the first clock signal CLK. The third NMOS transistor MN3 may be a second switch that selectively connects the reference voltage signal VINCOM to the first node NCB in response to the second clock signal CLKB. In this embodiment, a voltage level of the reference voltage signal VINCOM may be lower than a maximum level of the input voltage signal VIN.

The second PMOS transistor MP2 transfers the boosting voltage, which indicates the voltage at the boost node NCT, to the second node N1 in response to the second clock signal CLKB to generate the sampling control signal VCON_TRA.

The first NMOS transistor MN1 has a first electrode (for example, a drain) connected to the second node N1, a gate receiving the power supply voltage VDD and a second electrode (for example, a source). The second NMOS transistor MN2 has a first electrode (for example, a drain) connected to the second electrode of the first NMOS transistor MN1, a second electrode (for example, a source) connected to a ground voltage and a gate receiving the second clock signal CLKB. The first and second transistors MN1 and MN2 are configured to reset the second node N1 in response to the second clock signal CLKB and can operate as a third switch.

Hereinafter, an operation of the bootstrapped clock generator 110a of FIG. 2 will be described.

When a logic level of the first clock signal CLK is a first logic level, such as logic low level, the first PMOS transistor MP1 is turned on, the power supply voltage VDD is transferred to the boost node NCT. Since a logic level of the second clock signal CLKB is a second logic level, such as logic high level, the third NMOS transistor MN3 is turned on and the reference voltage signal VINCOM is transferred to the first node NCB. The level of the reference voltage signal VINCOM may be lower than the maximum level of the input voltage signal VIN, as described above. Thus, the initial level of the boost capacitor voltage is VDD-VINCOM in the present embodiment. In contrast, in a conventional bootstrapped clock generator, the initial level of a boost capacitor voltage is the level of the power supply voltage VDD.

When the logic level of the first clock signal CLK transitions from the first logic level to a second logic level, the first PMOS transistor MP1 is turned off. The second logic level may be a logic high level. Since the logic level of the second clock signal CLKB is the first logic level, such as logic low level, the third NMOS transistor MN3 is turned off, the CMOS transistor MC1 is turned on and the input voltage signal VIN is transferred to the first node NCB. Thus, the level of the boosting voltage is VDD-VINCOM+VIN. For example, a maximum level of the boosting voltage may be about 1.4V when the level of the power supply voltage VDD is about 1.2V, the level of the reference voltage signal VINCOM is about 0.3V and the maximum level of the input voltage signal VIN is about 0.5V.

When the logic level of the first clock signal CLK is the second logic level, such as a logic high level, the second PMOS transistor MP2 is turned on and the second NMOS transistor MN2 is turned off. The boosting voltage is transferred to the second node N1 through the second PMOS transistor MP2. Actually, when the logic level of the first clock signal CLK is the second logic level, the boost node NCT may share charge with the other circuit branches connected to the second node N1 through the second transistor MP2. Thus, the maximum level of the boosting voltage may be less than or equal to the level of the power supply voltage VDD e.g., about 1.2V. In addition, the MOS transistors included in the bootstrapped clock generator 110a and the track-and-hold unit 120 need not be high-voltage MOS transistors, but can instead comprise regular MOS transistors.

In typical conventional bootstrapped clock generators, both of the voltage level of the boosting voltage and the voltage level of the sampling control signal VCON_TRA are higher than the level of the power supply voltage VDD. Thus, additional protection circuits are required for protecting transistors included in the conventional bootstrapped clock generator. In addition, additional boosting circuits are required for providing a voltage that is applied to the gate of the first PMOS transistor MP1 in order to achieve stabilized switching operations. As a result, the structure of the conventional bootstrapped clock generator can be relatively complex.

On the contrary, in the bootstrapped clock generator 110a according to the example embodiments, the maximum level of the boosting voltage can be lower than or equal to the level of the power supply voltage VDD. Therefore, the bootstrapped clock generator 110a according to the example embodiments need not include additional protection circuits or boosting circuits. As a result, the bootstrapped clock generator 110a according to the example embodiments may have a relatively simple structure.

Figure 3:
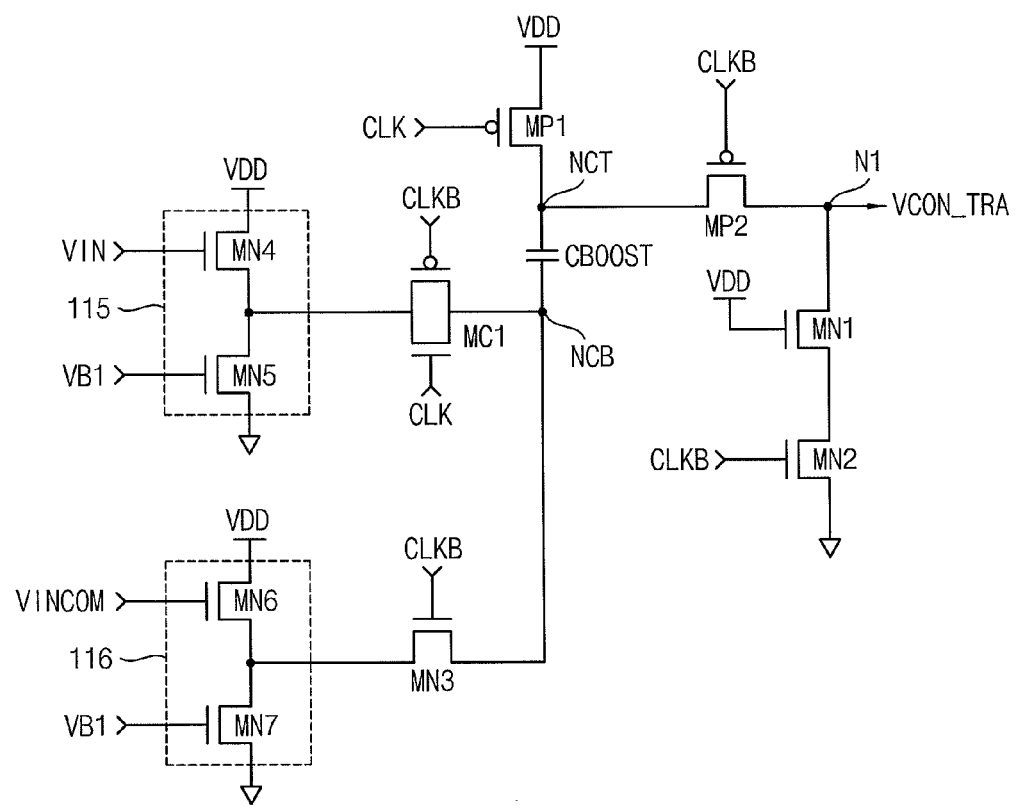
FIG. 3 is a circuit diagram illustrating another example of a bootstrapped clock generator included in the track-and-hold circuit of FIG. 1.

FIG. 3 is a circuit diagram illustrating another example of a bootstrapped clock generator 110b included in the track-and-hold circuit 100 of FIG. 1.

Referring to FIG. 3, the bootstrapped clock generator 110b may include a boost capacitor CBOOST, a CMOS transistor MC1, a first PMOS transistor MP1, a second PMOS transistor MP2, a first NMOS transistor MN1, a second NMOS transistor MN2, a third NMOS transistor MN3, a first input buffer 115 and a second input buffer 116.

The first input buffer 115 operates to buffer the input voltage signal VIN and the second input buffer 116 operates to buffer the reference voltage signal VINCOM. The level of the reference voltage signal VINCOM may be lower than the maximum level of the input voltage signal VIN. The boost capacitor CBOOST is connected between a boost node NCT and a first node NCB. The first PMOS transistor MP1 has a first electrode (for example, a source) connected to the power supply voltage VDD, a second electrode (for example, a drain) connected to the boost node NCT and a gate receiving the first clock signal CLK. The CMOS transistor MC1 may be a first switch that selectively connects an output signal of the first input buffer 115 to the first node NCB in response to the first and second clock signals CLK and CLKB. The second clock signal CLKB may be an inversion signal of the first clock signal CLK. The third NMOS transistor MN3 may be a second switch that selectively connects an output signal of the second input buffer 116 to the first node NCB in response to the second clock signal CLKB.

The second PMOS transistor MP2 transfers the boosting voltage, which indicates the voltage at the boost node NCT, to the second node N1 in response to the second clock signal CLKB to generate the sampling control signal VCON_TRA. The first NMOS transistor MN1 has a first electrode (for example, a drain) connected to the second node N1, a gate receiving the power supply voltage VDD and a second electrode (for example, a source). The second NMOS transistor MN2 has a first electrode (for example, a drain) connected to the second electrode of the first NMOS transistor MN1, a second electrode (for example, a source) connected to the ground voltage and a gate receiving the second clock signal CLKB. The first and second transistors MN1 and MN2 are configured to reset the second node N1 in response to the second clock signal CLKB and can operate as a third switch.

The first input buffer 115 may include a fourth NMOS transistor MN4 and a fifth NMOS transistor MN5. The fourth NMOS transistor MN4 has a first electrode (for example, a drain) connected to the power supply voltage VDD, a second electrode (for example, a source) connected to a first electrode of the CMOS transistor MC1 and a gate receiving the input voltage signal VIN. The fifth NMOS transistor MN5 has a first electrode (for example, a drain) connected to the second electrode of the fourth NMOS transistor MN4, a second electrode (for example, a source) connected to the ground voltage and a gate receiving a first bias voltage VB1.

The second input buffer 116 may include a sixth NMOS transistor MN6 and a seventh NMOS transistor MN7. The sixth NMOS transistor MN6 has a first electrode (for example, a drain) connected to the power supply voltage VDD, a second electrode (for example, a source) connected to a first electrode (for example, a drain) of the third NMOS transistor MN3 and a gate receiving the reference voltage signal VINCOM. The seventh NMOS transistor MN7 has a first electrode (for example, a drain) connected to the second electrode of the sixth NMOS transistor MN6, a second electrode (for example, a source) connected to the ground voltage and a gate receiving the first bias voltage VB1.

Hereinafter, an operation of the bootstrapped clock generator 110b of FIG. 3 will be described. In addition to the bootstrapped clock generator 110a of FIG. 2, the bootstrapped clock generator 110b of FIG. 3 further includes the first and second input buffers 115 and 116. The remainder of the operation is similar, and thus only differences between the operation of the bootstrapped clock generator 110a of FIG. 2 and the operation of the bootstrapped clock generator 110b of FIG. 3 will be described.

The first and second input buffers 115 and 116 may be replica input buffers such that configurations of the input buffers 115 and 116 may be substantially the same as an input buffer included in the track-and-hold unit 120. The first input buffer 115 operates to buffer the input voltage signal VIN and provides the buffered input voltage signal to the first node NCB. The second input buffer 116 operates to buffer the reference voltage signal VINCOM and provides the buffered reference voltage signal to the first node NCB. In this configuration, a path for the input signals through the track-and-hold unit 120 and a path for the boosting voltage through the bootstrapped clock generator 110b may be separated, and, as a result, in the track-and-hold circuit 100, glitch noises may be reduced and the settling time of the sampled signal VIS may be decreased.

Figure 4:
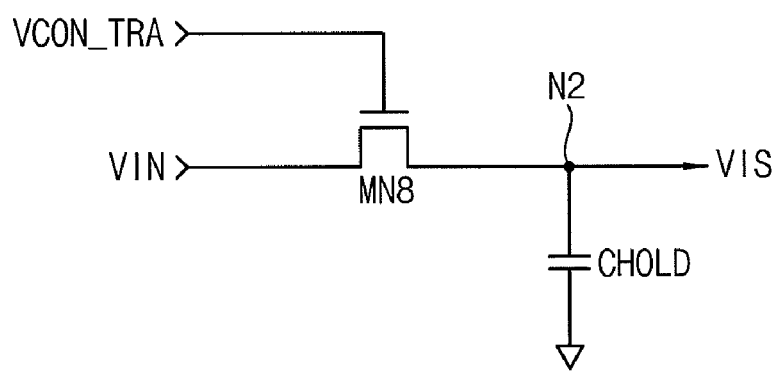
FIG. 4 is a circuit diagram illustrating an example of a track-and-hold unit included in the track-and-hold circuit of FIG. 1.

FIG. 4 is a circuit diagram illustrating an example of a track-and-hold unit 120a included in the track-and-hold circuit 100 of FIG. 1.

Referring to FIG. 4, the track-and-hold unit 120a may include an eighth NMOS transistor MN8 and a capacitor CHOLD.

The eighth NMOS transistor MN8 transfers the input voltage signal VIN to a third node N2 in response to the sampling control signal VCON_TRA. The capacitor CHOLD is connected between the third node N2 and the ground voltage. The sampled signal VIS is output from the third node N2.

When a logic level of the sampling control signal VCON_TRA is the second logic level, such as logic high level, the eighth NMOS transistor MN8 is turned on and the input voltage signal VIN is transferred to the third node N2. The capacitor CHOLD may maintain or hold the voltage at the third node N2, that is, the sampled signal VIS. When the logic level of the sampling control signal VCON_TRA is the first logic level, such as logic low level, the eighth NMOS transistor MN8 is turned off and the input voltage signal VIN is not transferred to the third node N2.

Figure 5:
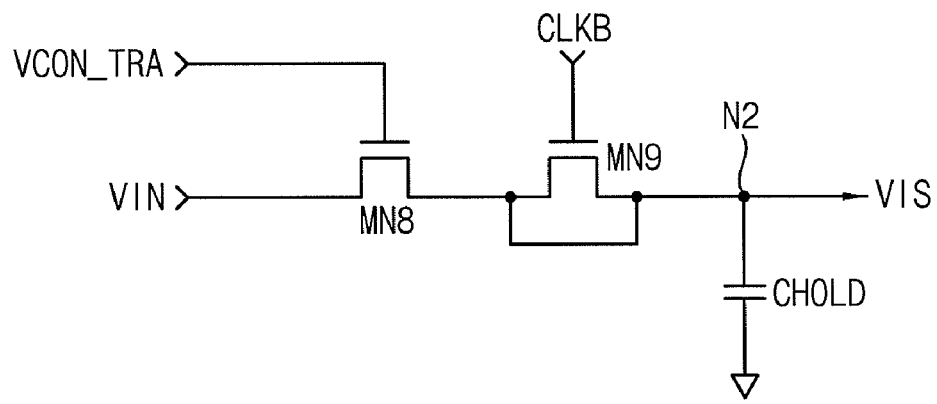
FIG. 5 is a circuit diagram illustrating another example of a track-and-hold unit included in the track-and-hold circuit of FIG. 1.

FIG. 5 is a circuit diagram illustrating another example of a track-and-hold unit 120b included in the track-and-hold circuit 100 of FIG. 1.

Referring to FIG. 5, the track-and-hold unit 120b may include an eighth NMOS transistor MN8, a ninth NMOS transistor MN9 and a capacitor CHOLD.

The eighth NMOS transistor MN8 transfers the input voltage signal VIN to a first electrode (for example, a drain) of the ninth NMOS transistor MN9 in response to the sampling control signal VCON_TRA. The ninth NMOS transistor MN9 is connected between a second electrode (for example, a source) of the eighth NMOS transistor MN8 and a third node N2. The first electrode and a second electrode (for example, a source) of the ninth NMOS transistor MN9 are electrically connected to each other. A gate of the ninth NMOS transistor MN9 receives the second clock signal CLKB. The capacitor CHOLD is connected between the third node N2 and the ground voltage. The sampled signal VIS is output from the third node N2.

Hereinafter, an operation of the track-and-hold unit 120b of FIG. 5 will be described.

The sampling control signal VCON_TRA is enabled when the logic level of the second clock signal CLKB is the first logic level, such as logic low level. When the sampling control signal VCON_TRA is enabled, for example the logic level of the sampling control signal VCON_TRA transitions to the second logic level, such as logic high level, the eighth NMOS transistor MN8 is turned on and the input voltage signal VIN is transferred to the first electrode of the ninth NMOS transistor MN9. Thus, the input voltage signal VIN is transferred to the third node N2 through a connection line disposed between the first and second electrodes of the ninth NMOS transistor MN9. The capacitor CHOLD may maintain or hold the voltage at the third node N2, that is, the sampled signal VIS.

The ninth NMOS transistor MN9 may be a dummy switch such that the first and second electrodes of the ninth NMOS transistor MN9 are electrically connected to each other. When the sampled signal VIS is generated in response to the sampling control signal VCONTRA, the track-and-hold unit 120b may effectively generate the sampled signal VIS by including the dummy switch. In particular, in this configuration, fluctuations of the sampled signal VIS caused by charge injection error may be reduced.

The ninth NMOS transistor MN9 may have a size that is suitable for mitigating, or fully cancelling, the fluctuations of the sampled signal VIS caused by charge injection error. For example, the size of the ninth NMOS transistor MN9 may be about a half of the size of the eighth NMOS transistor MN8.

Figure 6:
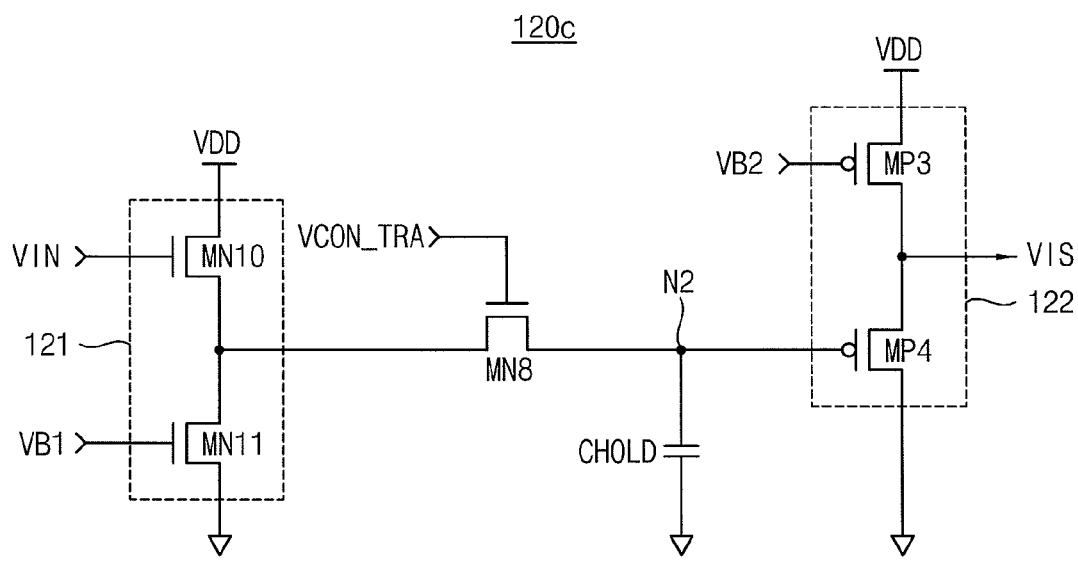
FIG. 6 is a circuit diagram illustrating still another example of a track-and-hold unit included in the track-and-hold circuit of FIG. 1.

FIG. 6 is a circuit diagram illustrating still another example of a track-and-hold unit 120c included in the track-and-hold circuit 100 of FIG. 1.

Referring to FIG. 6, the track-and-hold unit 120c may include a third input buffer 121, a eighth NMOS transistor MN8, a capacitor CHOLD and a first output buffer 122.

The third input buffer 121 operates to buffer the input voltage signal VIN. The eighth NMOS transistor MN8 transfers an output signal of the third input buffer 121 to a third node N2 in response to the sampling control signal VCON_TRA. The capacitor CHOLD is connected between the third node N2 and the ground voltage. The first output buffer 122 operates to buffer the voltage signal at the third node N2 to output the sampled signal VIS.

The third input buffer 121 may include a tenth NMOS transistor MN10 and an eleventh NMOS transistor MN11. The tenth NMOS transistor MN10 has a first electrode (for example, a drain) connected to the power supply voltage VDD, a second electrode (for example, a source) connected to the first electrode of the eighth NMOS transistor MN8 and a gate receiving the input voltage signal VIN. The eleventh NMOS transistor MN11 has a first electrode (for example, a drain) connected to the second electrode of the tenth NMOS transistor MN10, a second electrode (for example, a source) connected to the ground voltage and a gate receiving the first bias voltage VB1.

The first output buffer 122 may include a third PMOS transistor MP3 and a fourth PMOS transistor MP4. The third PMOS transistor MP3 has a first electrode (for example, a source) connected to the power supply voltage VDD, a second electrode (for example, a drain) outputting the sampled signal VIS and a gate receiving a second bias voltage VB2. The fourth PMOS transistor MP4 has a first electrode (for example, a source) connected to the second electrode of the third PMOS transistor MP3, a second electrode (for example, a drain) connected to the ground voltage and a gate connected to the third node N2.

The track-and-hold unit 120c may include the third input buffer 121 for maintaining an input impedance of the track-and-hold unit 120c at a constant level and may include the first output buffer 122 for maintaining an output impedance of the track-and-hold unit 120c at a constant level. The third input buffer 121 may be implemented with a source follower that includes the NMOS transistors MN10 and MN11. Configuration of the third input buffer 121 may be substantially same as the configuration of the first and second input buffers 115 and 116 included in the bootstrapped clock generator 110b of FIG. 3. The first output buffer 122 may be implemented with a source follower that includes the PMOS transistors MP3 and MP4.

Figure 7:
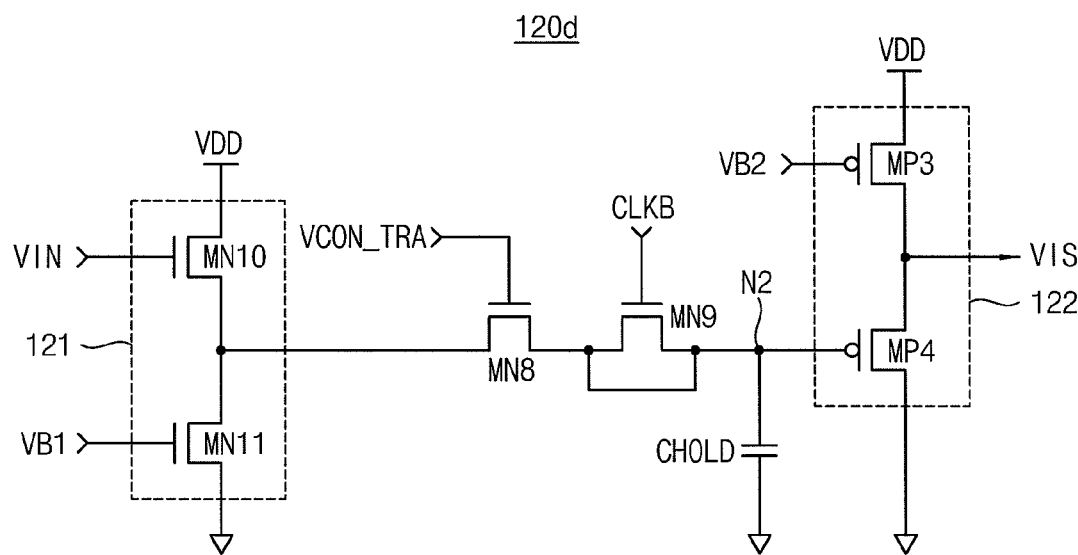
FIG. 7 is a circuit diagram illustrating still another example of a track-and-hold unit included in the track-and-hold circuit of FIG. 1.

FIG. 7 is a circuit diagram illustrating still another example of a track-and-hold unit 120d included in the track-and-hold circuit 100 of FIG. 1.

Referring to FIG. 7, the track-and-hold unit 120d may include a third input buffer 121, an eighth NMOS transistor MN8, a ninth NMOS transistor MN9, a capacitor CHOLD and a first output buffer 122.

The third input buffer 121 operates to buffer the input voltage signal VIN. The eighth NMOS transistor MN8 transfers an output signal of the third input buffer 121 to a first electrode (for example, a drain) of the ninth NMOS transistor MN9 in response to the sampling control signal VCON_TRA. The ninth NMOS transistor MN9 is connected between a second electrode (for example, a source) of the eighth NMOS transistor MN8 and a third node N2. The first electrode and a second electrode (for example, a source) of the ninth NMOS transistor MN9 are electrically connected to each other. A gate of the ninth NMOS transistor MN9 receives the second clock signal CLKB. The capacitor CHOLD is connected between the third node N2 and the ground voltage. The first output buffer 122 operates to buffer the voltage signal at the third node N2 to output the sampled signal VIS.

Compared with the track-and-hold unit 120c of FIG. 6, the track-and-hold unit 120d of FIG. 7 further includes the ninth NMOS transistor MN9 operating as the dummy switch. As described above, when the sampled signal VIS is provided in response to the sampling control signal VCON_TRA, the track-and-hold unit 120d may effectively generate the sampled signal VIS by including the dummy switch. In particular, in this configuration, the fluctuations of the sampled signal VIS caused by charge injection error may be reduced.

As described above, in the track-and-hold circuit 100 according to the example embodiments, the maximum level of the boosting voltage may be lower than or equal to the level of the power supply voltage VDD. Therefore, the track-and-hold circuit 100 need not include additional protection circuits and boosting circuits. As a result, the track-and-hold circuit 100 according to the example embodiments may have a relatively simple structure and may have improved reliability characteristics. In addition, the bootstrapped clock generator 110 may include a replica input buffer of a configuration that is substantially the same as the configuration of the input buffer included in the track-and-hold unit 120. Therefore, the path of the input signals through the track-and-hold unit 120 and the path for the boosting voltage through the bootstrapped clock generator 110 may be separated, and thus, glitch noise can be reduced and the settling time of the sampled signal can be decreased.

As described above, the track-and-hold circuit according to the example embodiments may be used in communication systems that require high-speed operation, high reliability and relatively simple structure. The track-and-hold circuit according to the example embodiments may be also used to memory systems that sample data based on the clock signal.

While the example embodiments and their advantages have been described in detail, it should be understood that various changes, substitutions and alterations may be made herein without departing from the scope of the inventive concept.

What is claimed is:

1. A bootstrapped clock generator comprising:
   a boost capacitor connected between a boost node and a first node;
   a first p-type metal oxide semiconductor (PMOS) transistor, connected between a power supply voltage and the boost node, which has a gate receiving a first clock signal;
   a first switch that selectively connects an input voltage signal to the first node in response to the first clock signal and a second clock signal, the second clock signal being an inversion signal of the first clock signal;
   a second switch that selectively connects a reference voltage signal to the first node in response to the second clock signal, a level of the reference voltage signal being lower than a maximum level of the input voltage signal;
   a second PMOS transistor that transfers a boosting voltage to a second node in response to the second clock signal and generates the sampling control signal, the boosting voltage being a voltage at the boost node; and
   a third switch that resets the second node in response to the second clock signal.

2. The bootstrapped clock generator of claim 1, wherein the sampling control signal having a voltage level lower than or equal to a level of the power supply voltage, is generated by maintaining an initial level of a boost capacitor voltage at a level lower than the level of the power supply voltage, the boost capacitor voltage being a voltage that is charged across the boost capacitor.

3. The bootstrapped clock generator of claim 1, wherein a level of a boosting voltage is lower than or equal to a level of the power supply voltage when the bootstrapped clock generator receives the input voltage signal, the boosting voltage being a voltage at the boost node.

4. The bootstrapped clock generator of claim 1, wherein the third switch includes:
   a first MOS transistor, connected to the second node, which has a gate receiving the power supply voltage; and
   a second MOS transistor, connected between the first MOS transistor and a ground voltage, which has a gate receiving the second clock signal.

5. The bootstrapped clock generator of claim 1, further comprising:
   a first input buffer that buffers the input voltage signal to provide the buffered input voltage signal to the first switch; and
   a second input buffer that buffers the reference voltage signal to provide the buffered reference voltage signal to the second switch.

* * * * *